US010734477B2

(12) United States Patent
Cheng et al.

(10) Patent No.: US 10,734,477 B2
(45) Date of Patent: Aug. 4, 2020

(54) FINFET WITH REDUCED PARASITIC CAPACITANCE

(71) Applicant: International Business Machines Corporation, Armonk, NY (US)

(72) Inventors: Kangguo Cheng, Schenectady, NY (US); Darsen D. Lu, Mount Kisco, NY (US); Xin Miao, Guilderland, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/245,289

(22) Filed: Jan. 11, 2019

(65) Prior Publication Data
US 2019/0165095 A1 May 30, 2019

Related U.S. Application Data

(60) Continuation of application No. 15/697,529, filed on Sep. 7, 2017, now Pat. No. 10,243,042, which is a
(Continued)

(51) Int. Cl.
*H01L 29/06* (2006.01)
*H01L 29/78* (2006.01)
(Continued)

(52) U.S. Cl.
CPC ........ *H01L 29/0649* (2013.01); *H01L 21/283* (2013.01); *H01L 29/41791* (2013.01);
(Continued)

(58) Field of Classification Search
CPC ........... H01L 29/6653; H01L 29/66545; H01L 29/6656; H01L 29/0649; H01L 21/764;
(Continued)

(56) References Cited

U.S. PATENT DOCUMENTS 4,520,482 A   5/1985   Fourre et al.
5,914,519 A   6/1999   Chou et al.
(Continued)

OTHER PUBLICATIONS

List of IBM Patents or Patent Applications Treated As Related; Date Filed:Jan. 21, 2019, 2 pages.
(Continued)

*Primary Examiner* — Eric A. Ward
*Assistant Examiner* — Eric K Ashbahian
(74) *Attorney, Agent, or Firm* — Cantor Colburn LLP; Vazken Alexanian

(57) ABSTRACT

A semiconductor device including at least one fin extending upward from a substrate and a gate on the substrate, wherein the gate includes outer sidewalls, wherein the fin extend through a width of the gate. A spacer material can be adjacent to the outer sidewalls of the gate, wherein a top surface of the spacer material is below the top surface of the gate and above the top surface of the fin. The semiconductor device can also include an epitaxial semiconductor layer over the fins on each side of the spacer material. A low-k dielectric material can be deposited above each epitaxial semiconductor layer. The semiconductor device also includes a dielectric top layer forming a top surface of the transistor, wherein the dielectric top layer seals an air gap between the top surface of the fins and the dielectric top layer.

20 Claims, 6 Drawing Sheets

Related U.S. Application Data division of application No. 14/957,809, filed on Dec. 3, 2015, now Pat. No. 9,786,737.

(51) Int. Cl.
| | | |
|---|---|---|
| *H01L 29/66* | (2006.01) | |
| *H01L 21/283* | (2006.01) | |
| *H01L 29/417* | (2006.01) | |
| *H01L 21/8234* | (2006.01) | |

(52) U.S. Cl.
CPC ...... *H01L 29/6653* (2013.01); *H01L 29/6656* (2013.01); *H01L 29/66545* (2013.01); *H01L 29/66795* (2013.01); *H01L 29/785* (2013.01); *H01L 21/823431* (2013.01)

(58) Field of Classification Search
CPC ... H01L 29/66795–66818; H01L 29/785–792; H01L 21/823431; H01L 21/823821; H01L 21/823481; H01L 27/0886; H01L 29/4991

See application file for complete search history.

(56) References Cited

U.S. PATENT DOCUMENTS

| | | | |
|---|---|---|---|
| 7,622,761 B2 | 11/2009 | Park et al. | |
| 8,637,384 B2 | 1/2014 | Ando et al. | |
| 8,637,930 B2 | 1/2014 | Ando et al. | |
| 9,123,774 B2 | 9/2015 | Suk et al. | |
| 9,520,482 B1* | 12/2016 | Chang | H01L 27/0924 |
| 9,786,737 B2 | 10/2017 | Cheng et al. | |
| 10,177,223 B2 | 1/2019 | Cheng et al. | |
| 10,243,042 B2 | 3/2019 | Cheng et al. | |
| 2012/0276711 A1 | 11/2012 | Yoon et al. | |
| 2013/0092984 A1 | 4/2013 | Liu et al. | |
| 2013/0093019 A1* | 4/2013 | Ando | H01L 29/785 257/347 |
| 2013/0221414 A1* | 8/2013 | Zhao | H01L 29/66795 257/288 |
| 2013/0309856 A1* | 11/2013 | Jagannathan | H01L 21/845 438/587 |
| 2014/0024192 A1* | 1/2014 | Kim | H01L 29/6653 438/296 |
| 2014/0138779 A1* | 5/2014 | Xie | H01L 29/66545 257/401 |
| 2014/0273359 A1 | 9/2014 | Kim et al. | |
| 2014/0291760 A1* | 10/2014 | Cheng | H01L 29/6681 257/347 |
| 2015/0255557 A1 | 9/2015 | Zhu et al. | |
| 2015/0263122 A1* | 9/2015 | Hsiao | H01L 29/515 257/401 |
| 2016/0181143 A1* | 6/2016 | Kwon | H01L 27/1052 438/586 |
| 2016/0365426 A1 | 12/2016 | Ching et al. | |
| 2017/0162650 A1 | 6/2017 | Cheng et al. | |
| 2017/0365659 A1 | 12/2017 | Cheng | |

OTHER PUBLICATIONS

Manoj et al., Impact of Fringe Capacitance on the Performance of Nanoscale FinFETS; IEEE Electron Device Letters, vol. 31, No. 1, 2010, 3 pages.

Wu, Kehuey et al.; "Toward 44% Switching Energy Reduction for FinFETs with Vacuum Gate Spacer," SISPAD 2012, Sep. 5-7, 2012, Denver, CO., pp. 253-256.

* cited by examiner

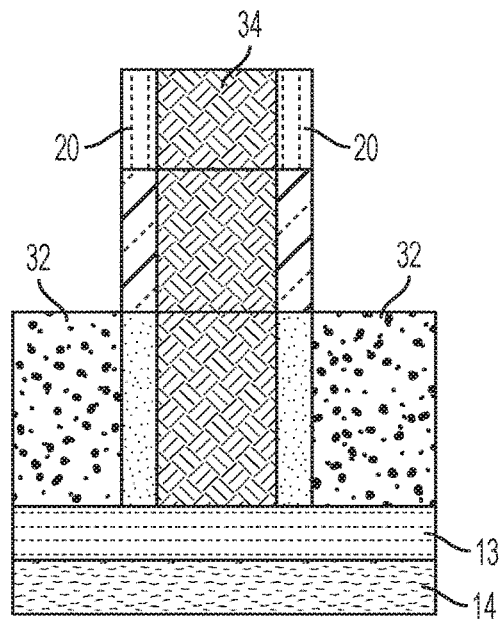
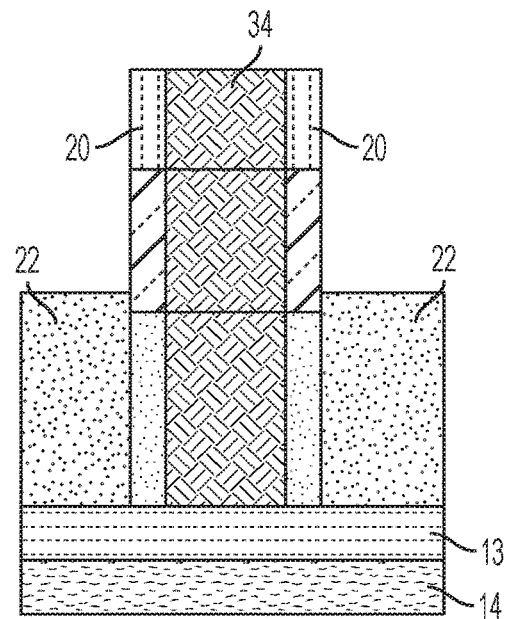
FIG. 4
FIG. 5
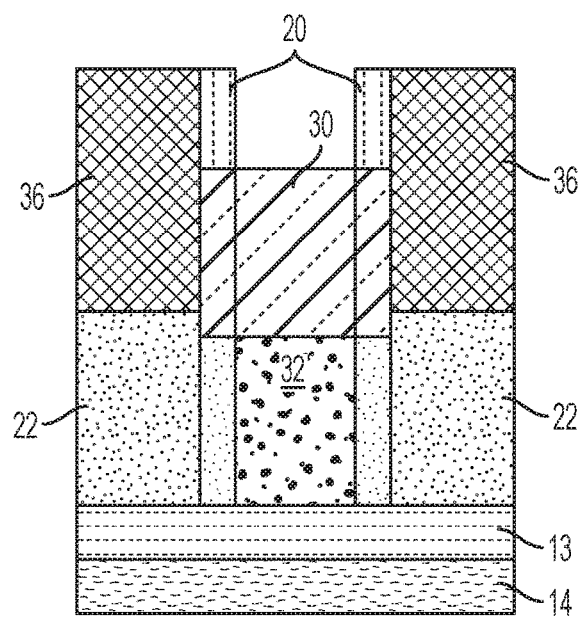
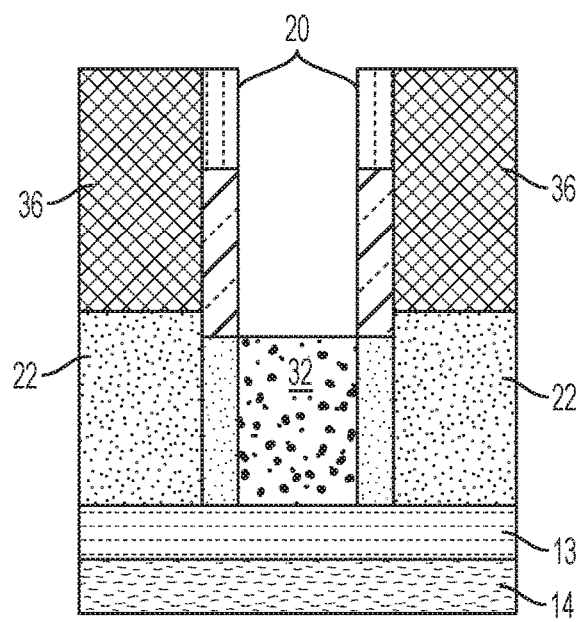
FIG. 6
FIG. 7

FINFET WITH REDUCED PARASITIC CAPACITANCE

DOMESTIC PRIORITY

The present application is a Continuation of U.S. application Ser. No. 15/697,529, which is a Divisional of U.S. patent application Ser. No. 14/957,809 filed Dec. 3, 2015, now U.S. Pat. No. 9,786,737, which are hereby incorporated by reference in their entirety.

BACKGROUND

The present invention relates to semiconductor devices, and more specifically, fin-like field effect transistors (Fin-FET).

Field effect transistors (FETs) include a source, a gate, and a drain. The action of the FET depends on the flow of majority carriers along a channel between the source and drain that runs past the gate. Current through the channel, which is between the source and drain is controlled by the transverse electric field under the gate. The length of the gate determines how fast the FET switches, and can be about the same length as the channel.

The size of FETs has been successfully reduced through the use of one or more fin-shaped channels. A FET employing such a channel structure can be referred to as a FinFET. Previously, complementary metal-oxide semiconductor (CMOS) devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel.

A challenge in fabricating multi-gate FETs is the inherently high parasitic capacitance as compared to conventional planar FETs. A need exists for a finFET with reduced parasitic capacitance.

SUMMARY

According to one embodiment, a method of forming a semiconductor device is provided. The method includes providing at least one fin on a substrate, wherein the fin includes a semiconductor bottom portion and a hardmask top portion; forming a dummy gate over a portion of the fin, wherein the dummy gate includes outer sidewalls, wherein the fin extend through the outer sidewalls of the dummy gate; forming spacer material adjacent to the outer sidewalls of the dummy gate; depositing an epitaxial semiconductor layer over the fin structure on each side of the spacer material; forming a source region on a first side of the spacer and a drain region on a second side of the spacer; depositing a low-k dielectric material on the upper surface of the epitaxial semiconductor layer, wherein the low-k dielectric material is adjacent to the spacer material; removing the dummy gate; depositing a gate material between the spacer material; removing an upper portion of the spacer material, wherein after removing the upper portion, a top surface of the spacer material is above a top surface of the semiconductor bottom portion of the fins and below a top surface of the hardmask top portion of the fins; removing the hardmask top portion of the fins; and depositing a dielectric top layer to form a top surface of the transistor, wherein the dielectric top surface seals an air gap positioned above each fin.

According to one embodiment, a method of forming a semiconductor device is provided. The method includes forming a fin; forming a gate, wherein the fins pass through sidewalls of the gate; forming spacer material on the sidewalls of the gate; forming epitaxial regions on each side of the spacer material; removing an upper portion of the spacer material, wherein after removal of the upper portion of the spacer material, a top surface of the spacer material is above a top surface of the fin; removing a section of the spacer material, wherein the section is directly above the top surface of the fin; and depositing a dielectric top layer to form a top surface of the transistor, wherein the dielectric top surface seals an air gap positioned above the fin.

According to one embodiment, a transistor is provided. The semiconductor device includes at least one fin on a substrate; a gate on the substrate, wherein the gate includes outer sidewalls, wherein the two fins extend through a width of the gate; spacer material adjacent to the outer sidewalls of the gate, wherein a top surface of the spacer material is below a top surface of the gate and above a top surface of the fin; an epitaxial semiconductor layer over the fin structure on each side of the spacer material; a low-k dielectric material above the epitaxial semiconductor layer, wherein the low-k dielectric material is adjacent to the spacer material; a dielectric top layer forming a top surface of the transistor; and an air gap sealed between the dielectric top layer and the top surface of the fin.

BRIEF DESCRIPTION OF THE DRAWINGS

FIGS. 2A through 13B illustrate an exemplary fabrication process of forming a transistor according to an embodiment, in which:

FIG. 2A is a cross-sectional view illustrating fin formation of the semiconductor device according to an embodiment;

FIG. 4 is a cross-sectional view of the semiconductor device illustrating the removal of a portion of the hardmask layer outside the spacer material and the implant of source and drain regions according to an embodiment;

FIG. 5 is a cross-sectional view of the semiconductor device illustrating growth of an epitaxial semiconductor layer over the fin structure adjacent to the spacer material according to an embodiment; and FIG. 6 is a cross-sectional view of the semiconductor device illustrating removal of the dummy gate according to an embodiment;

FIG. 7 is a cross-sectional view of the semiconductor device illustrating removal of the hardmask layer of a portion of the fins between the spacer material according to another embodiment;

FIG. 8 is a cross-sectional view of the semiconductor device illustrating formation of the gate between the spacer material according to an embodiment;

FIG. 9 is a cross-sectional view of the semiconductor device illustrating recess of the top portion of the gate and formation of a self-aligning contact cap according to an embodiment;

FIG. 10 is a cross-sectional view of the semiconductor device illustrating formation of contact regions and polishing of the self-aligning contact cap according to an embodiment;

FIG. 13B is a cross-sectional view of the plane indicated by the arrow in FIG. 13A.

DETAILED DESCRIPTION

The exemplary embodiments of this invention are described below in the context of a FinFET.

Figure 1A:
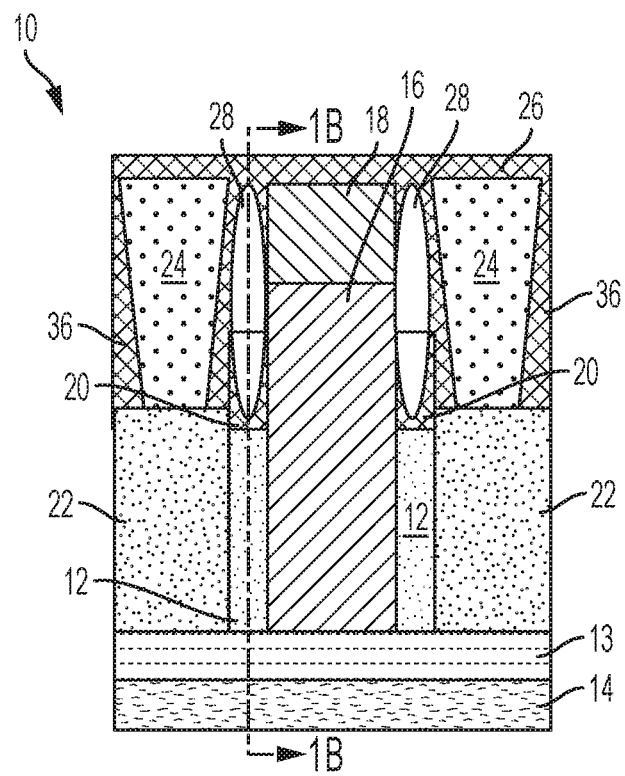
FIG. 1A is an illustration of a semiconductor device including an air gap according to an embodiment.
Figure 1B:
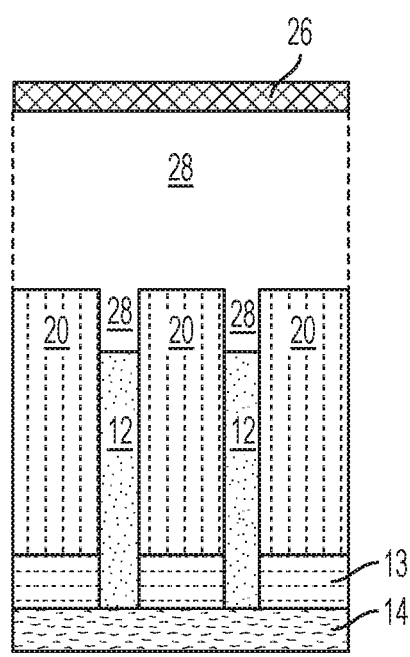
FIG. 1B is a cross-sectional view of the plane indicated by an arrow in FIG. 1A.

FIGS. 1A-1B illustrate an embodiment of the semiconductor device 10 according to an embodiment of the invention. The semiconductor device 10 includes fins 12 extending upward from a substrate 14. A shallow trench isolation layer 13 may be deposed on the surface of the substrate. The semiconductor device 10 also includes a gate 16 on the substrate 14, wherein the gate 16 includes outer sidewalls, wherein the two fins 12 extend through a width of the gate 16. The gate 16 can include a self-aligned contact cap 18 on the top surface of the gate 16. A spacer material 20 can be adjacent to the outer sidewalls of the gate 16, wherein a top surface 22 of the spacer material 20 is below the top surface of the gate 16 and above the top surface of the fins 12, as shown in FIG. 1B. The semiconductor device 10 can also include an epitaxial semiconductor layer 22 over the fins 12 on each side of the spacer material 20. A low-k dielectric material 36 can be deposited above each epitaxial semiconductor layer 22. Contact regions 24, for example trench silicide, can be positioned on each side of the spacer material 20, wherein the trench silicide regions 24 are positioned above the epitaxial semiconductor layers 22. In addition, the semiconductor device 10 can include a dielectric top layer 26 forming a top surface of the transistor 10.

As illustrated in FIGS. 1A-1B, the dielectric top layer 26 seals an air gap 28 between the dielectric top layer 26 and the top surface of the fins 12. The air gap 28 can be sealed between the dielectric top layer 26, the top surface of the fins 12, the gate 16, and the trench silicide regions 24. As mentioned above and shown in FIG. 1B, the semiconductor device 10 includes spacer material 20 on each side of the fins 12, wherein a top surface of the spacer material 20 is above the top surface of the fins 12. Further, the spacer material 20 directly above the top surface of the fins 12 is removed. As such the air gap 28 extends from the top surface of the fins 12 to the dielectric top layer 26 forming the top surface of the transistor 10. The air gap 28 can have a width of about 5 nm to about 10 nm, for example 6 nm to 8 nm.

FIGS. 2A-13B provide an overview of an embodiment of a method to fabricate an embodiment of a semiconductor device 10. The method of fabrication disclosed herein results in an air gap that provides enhanced electrical performance by reducing parasitic capacitance between the gate 16 and the source and drain regions 38, 40, i.e., between the gate 16 and the fins 12.

Figure 2A:
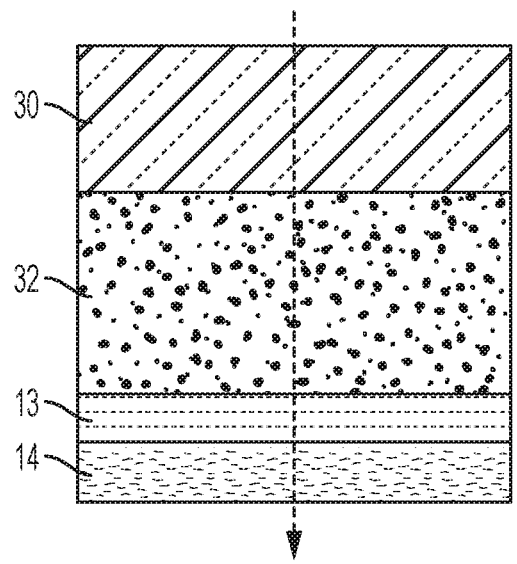
Figure 2B:
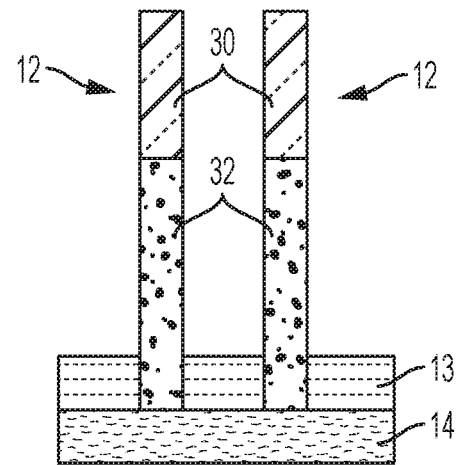
FIG. 2B is a cross-sectional view of the plane indicated by the arrow in FIG. 2A, according to an embodiment.

FIGS. 2A-2B show a hardmask top layer 30 of a material such as amorphous carbon, dielectric oxides (e.g., silicon oxide), dielectric nitrides (e.g., silicon nitride), dielectric oxynitrides, or any combination thereof on a semiconductor bottom layer 32 formed on a substrate 14, such as a semiconductor-on-insulator (SOI) layer substrate. In other embodiments the substrate 14 can be a bulk semiconductor substrate. The semiconductor layer 32 and hardmask layer 30 can be etched to form fins 12, for example by reactive ion etching (ME), as shown in the cross-section in FIG. 2B. The resulting fins include a semiconductor bottom layer 32 and a hardmask top layer 30.

Figure 3A:
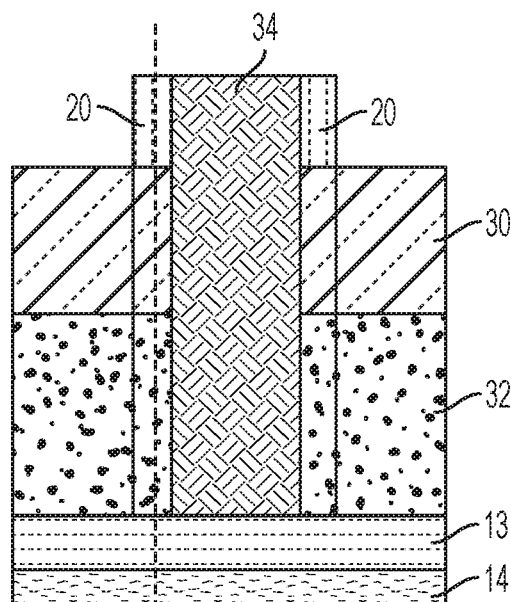
FIG. 3A is a cross-sectional view of the semiconductor device illustrating depositing a dummy gate and spacer material according to an embodiment.
Figure 3B:
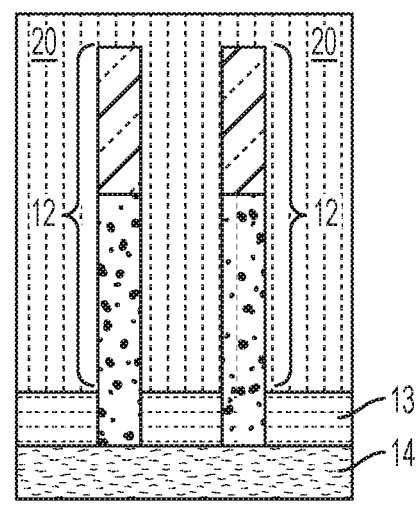
FIG. 3B is a cross-sectional view of the plane indicated by the arrow in FIG. 2A, according to an embodiment.

FIGS. 3A-3B show a result of a dummy gate 34 deposition. The dummy gate (sacrificial gate) 34 is formed perpendicular to the lengths of the fins 12. In other words, the fins 12 extend through the sidewalls of the width of the dummy gate 34. The dummy gate 34 can be formed by deposition of a polysilicon material, planarization using a suitable process such as, for example, chemical mechanical polishing (CMP), gate lithography, and reactive ion etching (RIE) that defines the dummy gate stack 34.

The spacer material 20 can be formed along the outer sidewalls of the dummy gate 34. The spacer material 20 may include, for example, dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). The spacer material may be etched by a dry etch process, for example, a RIE process.

FIG. 4 illustrates removal of the hardmask top layer 30 on the portion of the fins 12 extending outside the spacer material 20. The hardmask layer 30 can be removed by any suitable technique, such as an RIE process.

As shown in FIG. 5, an epitaxial semiconductor layer 22 is grown or deposited on each side of the spacer material 20. The epitaxial semiconductor layer 22 can be deposited over a portion of the fins 12 outside the spacer material 20, wherein the epitaxial semiconductor layer 22 is adjacent to the spacer material 20. The epitaxial semiconductor layer 22 is formed by an epitaxial growth process that deposits around or on top of the exposed portions of the fins. Epitaxial layers may be grown from gaseous or liquid precursors. Epitaxial semiconductor may be grown using vapor-phase epitaxy (VPE), molecular-beam epitaxy (MBE), liquid-phase epitaxy (LPE), or other suitable process.

FIG. 6 illustrates the removal of the dummy gate 34 to expose a channel region of the two fins 12 positioned between the spacer material 20. FIG. 6, also depicts the deposition of a low-k dielectric material 36 deposited above the epitaxial semiconductor layer 22.

FIG. 7 illustrates the result of removing the hardmask layer 30 between the spacer material 20, exposing the semiconductor layer 32. The hardmask layer 30 can be removed by any suitable method, including, but not limited to reactive ion etching (ME).

Figure 8:
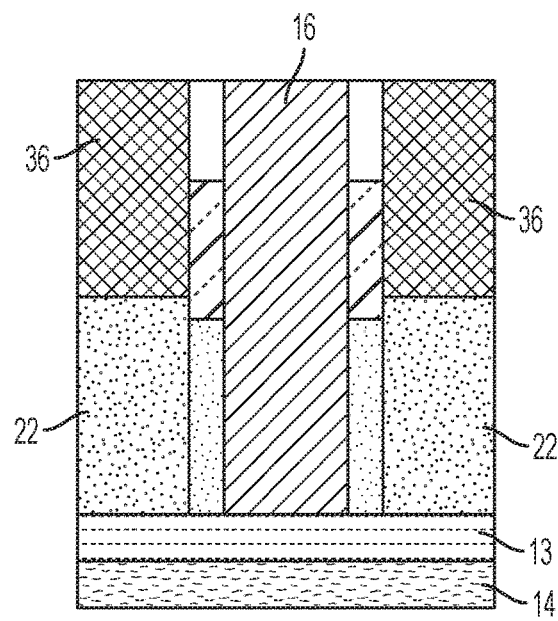
Figure 9:
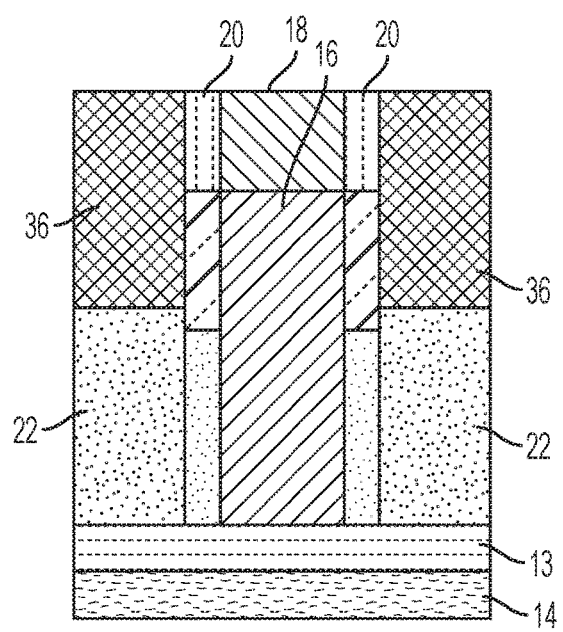

FIG. 8 illustrates the deposition of gate material 16 between the spacer material 20. The gate materials include the gate dielectric and gate metal. The gate metal can include any metallic, conductive material. A self-aligned contact cap 18 can be formed on the top surface of the gate 16. As shown in FIG. 9, a top portion of the gate 16 can be recessed such that the self-aligned contact cap 18 can be deposited and polished.

The gate stack can include high-k metal gates formed, for example, by filling a dummy gate opening (not shown) with one or more high-k dielectric materials, one or more work function metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Work function metal(s) may be disposed over the high-k dielectric material. The type of work function metal(s) depends on the type of transistor and may differ between the NFET 101 and the PFET 102. Non-limiting examples of suitable work function metals include p-type work function metal materials and n-type work function metal materials. P-type work function materials include compositions such as ruthenium, palladium, platinum, cobalt, nickel, titanium, metal carbides (e.g., hafnium carbide, zirconium carbide, titanium carbide, and aluminum carbide), metal nitrides (e.g., titanium nitride), and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), metal nitrides (e.g., titanium nitride), aluminides, or any combination thereof.

A conductive metal can be deposited over the high-k dielectric material(s) and work function layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), can be performed to polish the surface of the conductive gate metal.

Figure 10:
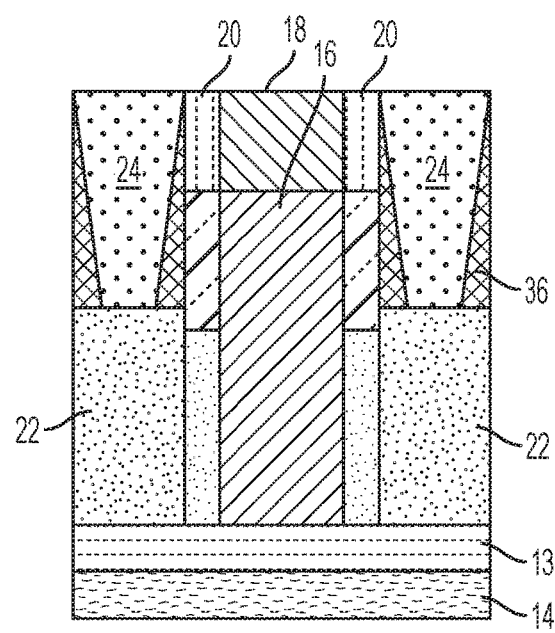

As shown in FIG. 10, trench silicide regions 24 may be formed on the epitaxial semiconductor layer 22, wherein the trench silicide regions 24 are on each side of the spacer material 20. The trench silicide regions 24 may be formed by, for example, example forming a metal silicide film by performing a thermal treatment to a metallic film. The metallic film can be deposited by performing an evaporation process or a sputtering process. The metallic film is annealed by heating inside a furnace or performing a rapid thermal treatment in an atmosphere containing pure inert gases (e.g., nitrogen or argon) so that the metal reacts with exposed silicon to form a metal silicide layer. Non-limiting examples of suitable metal silicide materials include titanium silicide, tungsten silicide, cobalt silicide, nickel silicide, molybdenum silicide, platinum silicide, or any combination thereof.

Figure 11A:
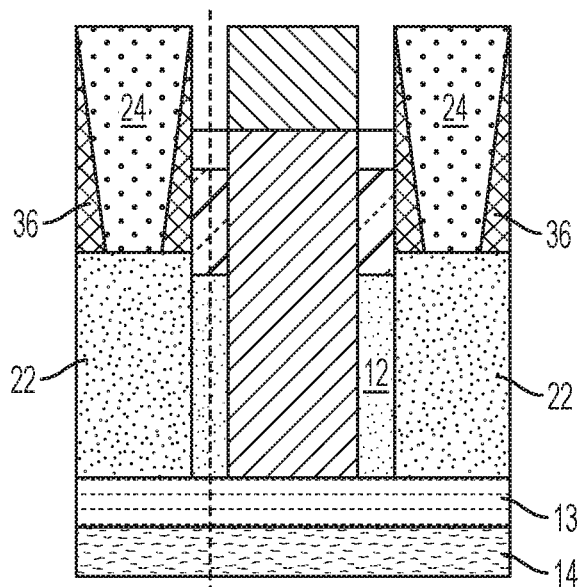
FIG. 11A is a cross-sectional view of the semiconductor device illustrating removal of a portion of the spacer to expose the hardmask top portion of the fins in the spacer region according to an embodiment.
Figure 11B:
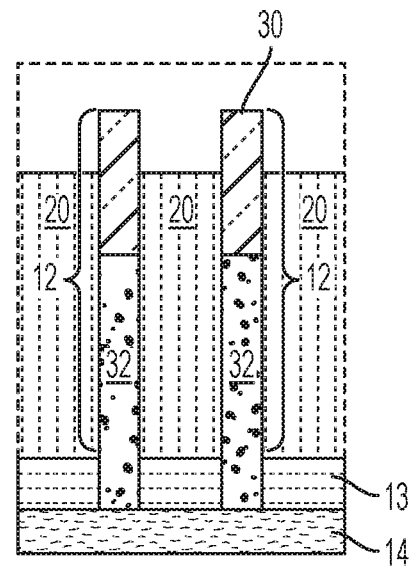
FIG. 11B is a cross-sectional view of the plane indicated by the arrow in FIG. 11A.

As shown in FIGS. 11A-11B, controlled etching is performed to remove a portion of the spacer material 20, such that after etching the top surface of the spacer material 20 is above the semiconductor layer 32 of the fins 12, but below the top surface of the hardmask layer 30 of the fins 12. The spacer material 20 can be removed by a selective wet chemical etch process, such as by the use of hot phosphoric acid, or selective RIE process. In an example, the removal of the upper portion of the spacer material can form an air gap adjacent to the sidewalls of the gate.

Figure 12A:
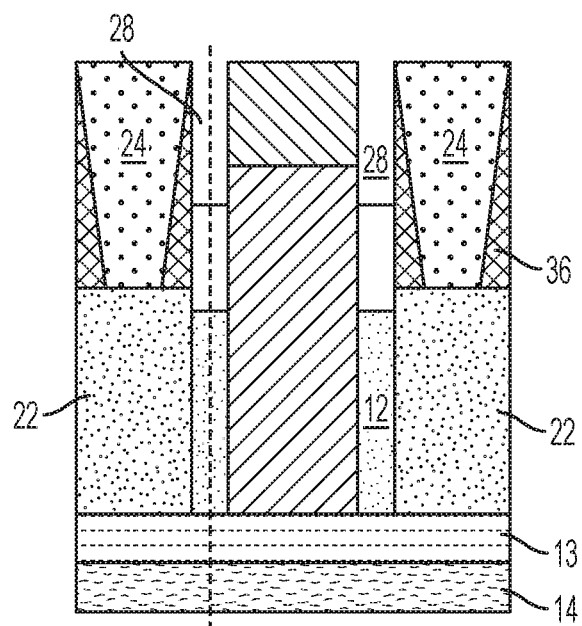
FIG. 12A is a cross-sectional view of the semiconductor device illustrating removal of the hardmask top layer of the fins in the spacer region according to an embodiment.
Figure 12B:
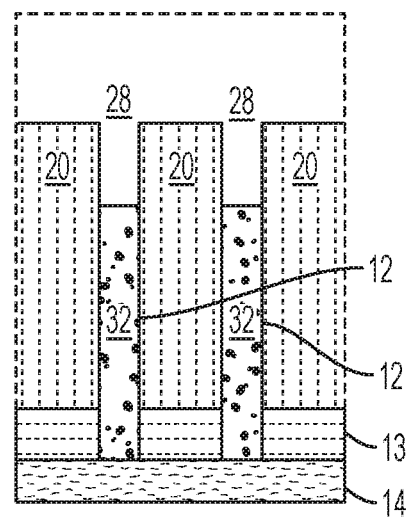
FIG. 12B is a cross-sectional view of the plane indicated by the arrow in FIG. 12A.

FIGS. 12A-12B illustrates the result of the selective removal of the hardmask top portion 30 of the fins 12. The removal of the hardmask top portion 30 leaves an air gap 28 that extends below the top surface of the spacer material 20 to reach the top surface of the semiconductor bottom layer 32 of the fins 12.

In an example, an upper portion of the spacer material can be removed, such that after removal of the upper portion of the spacer material, a top surface of the spacer material 20 is above a top surface of the fins 12. In such example, a section of the spacer material is then removed which is directly above the top surface of the fins. The removal of the section of the spacer material directly above the top surface of the fins leaves an air gap 28 that extends below the top surface of the spacer material 20 to reach the top surface of the semiconductor bottom layer 32 of the fins 12.

Figure 13A:
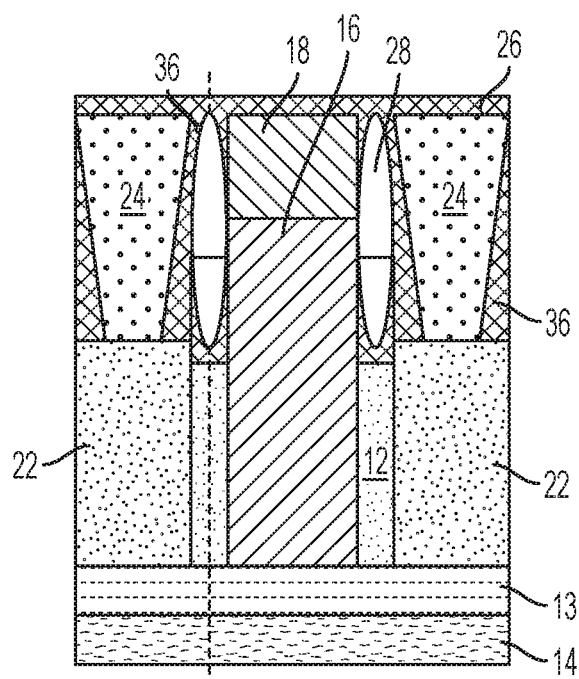
FIG. 13A is a cross-sectional view of the semiconductor device illustrating deposition of a dielectric top layer to create a top surface of the transistor according to an embodiment.
Figure 13B:
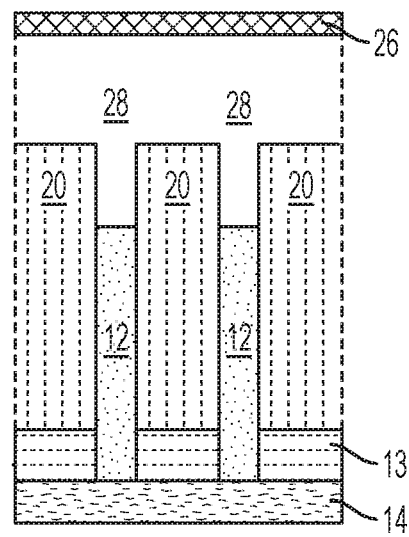

FIGS. 13A-13B illustrate the deposition of a dielectric top layer 26 to form a top surface of the transistor 10. The dielectric top layer 26 can be deposited using a relatively low temperature (e.g., 350° C.) plasma-enhanced chemical vapor deposition (PECVD) process. With the deposition of the dielectric top layer 26, the air gap 28 is sealed between the dielectric top layer 26 and the top surface of the fins 12. The air gap 28 can also be between the low-k dielectric material 36 and the gate 16 and/or self-aligned contact cap 18. In an example, the air gap 28 is positioned between the gate 16, dielectric top layer 26, the trench silicide regions 24, and the top surface of the fins 12.

Because the dielectric constant of air is about unity as compared to the dielectric constant of the spacer material (for example, SiN has a dielectric constant of 7-7.5), the resulting air gap 28 provides enhanced electrical performance by reducing parasitic capacitance between the gate 16 and the source and drain regions 38, 40, i.e., between the gate 16 and the fins 12.

The semiconductor device 10 can be implemented as an N-type or a P-type device. The gate 16 can be fabricated using polysilicon or metal, any suitable gate dielectric material can be used, and the silicide layers can be composed of any suitable type of silicide.

The semiconductor device 10 can be constructed to have a single fin or channel structures passing through the width of the gate, or there can be two or more fins or channel structures passing through the width of the gate. The invention herein also applies to multi-gate transistors. In addition, it should be appreciated that the exemplary embodiments of this invention also apply to wire-type transistors, wherein the channel structure passes through the width of the gate stack such that all surfaces of the channel structure are adjacent to or surrounded by the gate and can be electrically influenced by the gate stack. In such example there can be any number of wire-type channel structures passing through the width of the gate stack. It should be appreciated that the FinFET or semiconductor device are not to be constructed as being limited to or by only the exemplary geometries, materials, dielectric films, fabrication processes, dimensions, and/or layer thicknesses mentioned above.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
   at least one fin on a substrate;
   a gate on the substrate, wherein the gate includes outer sidewalls, wherein the at least one fin extends through a width of the gate;
   spacer material adjacent to the outer sidewalls of the gate;
   an epitaxial semiconductor layer over the at least one fin on each side of the spacer material;
   a dielectric material above the epitaxial semiconductor layer, wherein the dielectric material is adjacent to the spacer material;
   a dielectric top layer forming a top surface of the transistor; and
   an air gap sealed between the dielectric top layer and a bottom surface, the bottom surface comprising a top surface of the at least one fin and a top surface of the spacer material in contact with the at least one fin, the air gap extending beyond a top surface of the gate.

2. The semiconductor device of claim 1, wherein the air gap has a width of about 3 nm to about 10 nm.

3. The semiconductor device of claim 1, wherein the air gap is continuous from the top surface of the at least one fin to a pinch-off region defined by the dielectric top layer that seals the air gap.

4. The semiconductor device of claim 1, wherein the dielectric top layer includes nitrides.

5. The semiconductor device of claim 1, wherein the dielectric top layer includes oxides.

6. The semiconductor device of claim 1, further comprising a source region on a first side of the spacer and a drain region on a second side of the spacer.

7. The semiconductor device of claim 1, wherein a bottom portion of the air gap extends below the top surface of the spacer material.

8. The semiconductor device of claim 1, wherein a self-aligned contact cap directly contacts the top surface of the gate.

9. The semiconductor device of claim 1, further comprising trench silicide regions in the dielectric material.

10. The semiconductor device of claim 9, wherein the trench silicide regions are positioned above the epitaxial semiconductor layer.

11. A semiconductor device, comprising:
    a plurality of fins on a substrate;
    a gate on the substrate, wherein the gate includes outer sidewalls, wherein the plurality of fins extend through a width of the gate;
    spacer material adjacent to the outer sidewalls of the gate;
    an epitaxial semiconductor layer over the plurality of fins on each side of the spacer material;
    a dielectric material above the epitaxial semiconductor layer, wherein the dielectric material is adjacent to the spacer material;
    a dielectric top layer forming a top surface of the transistor; and
    an air gap sealed between the dielectric top layer and a bottom surface, the bottom surface comprising a top surface of the plurality of fins and a top surface of the spacer material in contact with the plurality of the fins, the air gap extending beyond a top surface of the gate.

12. The semiconductor device of claim 11, wherein the air gap has a width of about 3 nm to about 10 nm.

13. The semiconductor device of claim 11, wherein the air gap is continuous from the top surface of the plurality of fins to a pinch-off region defined by the dielectric top layer that seals the air gap.

14. The semiconductor device of claim 11, wherein the dielectric top layer includes nitrides.

15. The semiconductor device of claim 11, wherein the dielectric top layer includes oxides.

16. The semiconductor device of claim 11, further comprising a source region on a first side of the spacer and a drain region on a second side of the spacer.

17. The semiconductor device of claim 11, wherein a bottom portion of the air gap extends below the top surface of the spacer material.

18. The semiconductor device of claim 1, wherein a self-aligned contact cap directly contacts the top surface of the gate.

19. The semiconductor device of claim 11, further comprising trench silicide regions in the dielectric material.

20. The semiconductor device of claim 19, wherein the trench silicide regions are positioned above the epitaxial semiconductor layer.

* * * * *